United States Patent [19]

Willis

[11] 4,264,986

[45] Apr. 28, 1981

[54] INFORMATION-RECORDING PROCESS & APPARATUS

[76] Inventor: Craig I. Willis, 34 Newstead Rd., Weston, Ontario, M9P 3A3, Canada

[21] Appl. No.: 19,443

[22] Filed: Mar. 12, 1979

[51] Int. Cl.$^3$ .............................................. G11C 13/04
[52] U.S. Cl. .................................. 365/124; 365/113; 365/120; 365/127
[58] Field of Search ............... 365/113, 114, 120, 124, 365/126, 127, 128

[56] References Cited

U.S. PATENT DOCUMENTS

| | | | |
|---|---|---|---|
| 3,530,441 | 9/1970 | Ovshinsky | 365/113 |
| 3,636,526 | 1/1972 | Feinleib . | |
| 3,750,117 | 7/1973 | Chen et al. . | |
| 3,760,383 | 9/1973 | Wolfe et al. | 365/118 |
| 3,778,785 | 12/1973 | Von Gutfeld . | |
| 3,802,879 | 4/1974 | Ovshinsky et al. . | |
| 3,820,087 | 6/1974 | Chaudharl et al. . | |
| 3,893,129 | 7/1975 | Endo et al. | 346/77 E |
| 3,949,387 | 4/1976 | Chaudharl et al. . | |

FOREIGN PATENT DOCUMENTS

1474199 5/1977 United Kingdom .

OTHER PUBLICATIONS

Chaudharl et al., "The Structure of Laser Written Lines in a Te$_{81}$Ge$_{15}$As$_4$ Glass", Jour. of Non-crystalline Solids, 8–10, 1972, pp. 900–908, North-Holland Pub. Co.
Feinleib et al., "Reversible Optical Effects in Amorphous Semiconductors", Jour. of Non-Crystalline Solids, 8–10, 1972, pp. 909–916, North-Holland Pub. Co.
Ovshinsky et al., "Amorphous Semiconstructors for Switching, Memory, and Imaging Applications", IEEE Trans. on Electron Dev., vol. Ed-20, No. 2, pp. 91–105, 2/73.
Ovshinsky, "Amorphous Materials as Optical Informtion Media, " Journal of Applied Photographic Engineering, vol. 3, No., 1, Winter 1977, pp. 35–39.
Adler et al., "Optics of Solid State Phase Transformations, " The Physics of Opto-Electronic Materials, Plenum Publishing Corp. N.Y., pp. 233–253.
Feinleib et al., "Rapid Reversible Light–Induced Crystallization of Amorphous Semiconductors", Applied Physics Letters, vol. 18, No. 6, 3/15/71.
Ovshinski et al., "Reversible Structural Transformations in Amorphous Semiconductors for Memory and Logic, " Metallurgical Transactions, vol. 2, 3/71, pp. 641–645.
Bovsky et al., "Characteristics of Scanning Laser and Electron Beams in Bulk Data Storage", IEEE Trans. on Magnetics, 9/17, pp. 594–598.
Ovshinsky et al., "Imaging in Amorphous Materials by Structural Alterations, " Jour. of Non-Crystaline Solids, 8–10, 1972, pp. 892–898.
Von Gutfeld et al., "Laser Writing and Erasing on Chalcogenide films", J. Appl. Phys., vol. 43, No. 11, 11/72, pp. 4688-4693.
Johnson et al., "Thermoplastic Recording", Optical Engineering, vol. 17, No. 3, May–Jun. 1978, pp. 252–255.
Bartolini et al., "Optical disk systems emerge", IEEE Spectrum, 8/78, pp. 20–28.

*Primary Examiner*—Stuart N. Hecker
*Attorney, Agent, or Firm*—Ridout & Maybee

[57] ABSTRACT

Information-recording process in which a pulsed laser produces recording marks in the form of crisply-defined areas of surface relief on the surface of a recording medium such as APIEZON W wax, iodine doped epoxy resin, and other materials. The medium is selectively producable in different density states by cooling it at a selected cooling rate from the molten state, and can be switched between said states by controlled exposure to the laser light, thus permitting recording, erasing, and recording on the medium. The permits very small marks of less than 1 micron diameter to be produced using a diffraction-limited spot of light, and as surface relief of high aspect ratio can be obtained at low power levels, it is possible to achieve high packing densities and high signal to noise ratio at low energy costs.

37 Claims, 8 Drawing Figures

INFORMATION-RECORDING PROCESS & APPARATUS

BACKGROUND OF INVENTION

This invention relates to information storage devices and, in particular, to an erasable and reusable archival memory utilizing a highly focused laser beam for recording, reading and erasing.

Since the early 1960's, it has been apparent to those involved with the recording art that optical recording, and in particular, optical disc recording, is a very promising method because it allows instantaneous playback, very fast random access, and much higher recording density than is possible with magnetic recording, and archival storage. It is widely recognized that the optical disc system with the greatest potential is the type that uses a highly focused laser beam as an ultra-fine recording stylus to store encoded information at very high data rates with extremely high density.

In pursuit of the vast potential offered by this method, the laser recording art has progressed to the point where there are numerous different recording processes contending to provide the first practical laser recording system. However, in spite of all the activity in the field, no one has come forward with a practical system that is economical enough to be marketed on a large scale. The reason is that each and every recording process known has at least one significant flaw or disadvantage.

The recording process must have a high enough resolution to allow the recording of marks of very small size to satisfy the requirement of high packing density, and the sensitivity of the process must be high enough to permit the use of economical, low power recording lasers. But the sensitivity should be low enough so that the recording medium can withstand a playback exposure high enough to yield a high signal to noise ratio. Furthermore, it is clear that in order to avoid long term degradation due to ambient conditions, and to ensure totally non-destructive readout, the process must have a well defined exposure threshold below which there is no response. In addition, it is desired that the recording process should permit instant playback without the need for post-recording processing before readout. None of the presently known processes meet all these requirements.

One known method involves using heat to induce a stable transition between two structural states having different optical properties, namely the amorphous state and the crystalline state. In the prior art, the only materials known to be useful in this process were the amorphous semiconductors and the chalcogenides.

One type of reversible mass optical memory based on these structural changes involves a photon enhanced transformation from the amorphous state to the crystalline state. The major drawbacks of this process are that it has relatively low sensitivity (typically $10^{-2}$ J/cm$^2$) low resolution (typically 500 lines per mm maximum) limited by the size of the crystalline grains, and slow write times which are limited by the inherent delay due to the crystallization process. This delay severely limits the recording rate because the transition to the crystalline state depends on the presence of the recording beam.

In a further process using amorphous thin films of chalcogenides, a crystalline track is first made with a continuous wave laser, and the bits are written by amorphizing with the pulsed laser. This is called a reverse mode process. Erasing is done by moving the track under a continuous wave laser spot of low power. A bulk erase is also possible by heating up the entire film above the glass forming temperature of about 120° C. There is a difficulty with the continuous wave laser erase: the degree of crystallization in the track tends to increase after each erase, which causes an increase in the amount of amorphizing energy required. Thus, if a large number of erases are required, a method of stabilizing the track density must be found. Reverse mode writing has the advantage that writing is done by the fast amorphizing process—the speed is limited by the laser not the film. In forward mode, writing is by the slower crystallizing process, which requires about 1 μsec per bit.

These processes employing semiconductor and chalcogenide films rely on changes in the optical transmission and reflectance properties that occur when a transition takes place from one morphological state to another. As these changes are not very great, a high signal to noise ratio is not obtainable with these processes.

SUMMARY OF THE INVENTION

In this invention a pulsed laser beam is used to inject a pulse of heat energy into a smooth-surfaced recording medium to produce a recording mark left on the surface of the recording medium in the form of a crisply-defined change in surface curvature i.e. a crisply-defined bump or a crisply-defined pit or crater.

This is achieved employing a recording medium in which changes in density are producible on exposure to a controlled regime of heating and cooling, and which has sufficient transparency or transmissivity with respect to the laser radiation that the radiation penetrates downwardly through the recording medium and, owing to the heating effect of the radiation, transiently melts a volume which whose depth is typically large in comparison with the diameter of the spot that is melted at the surface of the medium.

The invention provides an information-recording process comprising irradiating an optically smooth and homogeneous surface of a recording medium with a laser beam of a predetermined wavelength, said medium being a solid having first and second states and being selectively producible in said states by heating said medium and cooling it from the heated state at selected rates of cooling, pulsing said laser beam to thereby heat a sharply-defined localised volume of said medium adjacent the surface, said volume extending sufficiently deeply into the medium that on transition between the first and second states there is obtained an area on said surface bordered by a crisp discontinuity from the plane of said surface and exhibiting a change in surface curvature with a vertical to transverse aspect ratio of at least 1:10; and permitting said volume to cool at a rate such that a transition between said first and second states is obtained, whereby said area of changed surface curvature on said surface is obtained in crisply-defined relief.

An important advantage of the present process is that on playback or reproduction of the recorded information a high signal-to-noise ratio can be obtained. When a spot of light of diameter comparable with the width of the area of changed surface curvature, i.e. the bump or pit, is scanned over the surface of the recording medium, good reflectance is obtained from the unmarked, flat or smooth areas of the recording medium, but when the spot strikes a pit or bump having an aspect ratio of at least 1:10, the light is scattered because of the curvature of the surface, and therefore a signal in the form of a strongly marked drop in the intensity of reflected light, as measured with a suitable optical sensor, can be detected. Moreover, by employing a novel form of optical filter, described in more detail hereinafter, that cuts down the amount of reflected light collected from the surface of the medium so that all or a majority of the amount of light received by the sensor is selected from a portion of the back-reflected beam which is more heavily modulated than the rest of the beam, a significant increase in the amplitude of the detected signal can be obtained, corresponding to an increased contrast between the intensity of beams reflected from the smooth surface of the medium, and from the bump or pit, respectively.

Although in the most advantageous applications of the present application, a laser stylus is employed to melt said sharply-defined localised volume of the recording medium, there are alternative, although less convenient, devices for rapidly and transiently heating a localised volume of a meltable medium, e.g. electron or non-laser electro-magnetic radiation beams, and the use of fine heating wires embedded in the medium, and the use of all such devices is within the scope of the present invention.

Accordingly, the invention also provides an information-recording process comprising the steps of:
  providing a recording medium exhibiting first and second stable physical states associated with different respective specific volumes and being selectively producible in said states by heating said medium and cooling it from the heated state at selected rates of cooling;
  applying heat transiently to a localised volume of said medium adjacent its surface of said layer, said volume being sufficiently large in relation to the area of the surface of the layer that is heated that on transition between said first and second states an area of change surface curvature exhibiting a vertical to transverse aspect ratio of at least 1:10 is produced at said surface, said area providing at its edge a crisp discontinuity from the plane of the surface of said layer; said medium being originally in one of said first and second states; and permitting said volume to cool under conditions selected so that said volume is converted to the other of said first and second states.

BRIEF DESCRIPTION OF THE DRAWINGS

The invention will now be described in greater detail with reference to the accompanying drawings in which.

DESCRIPTION OF THE PREFERRED EMBODIMENTS

Figure 1:
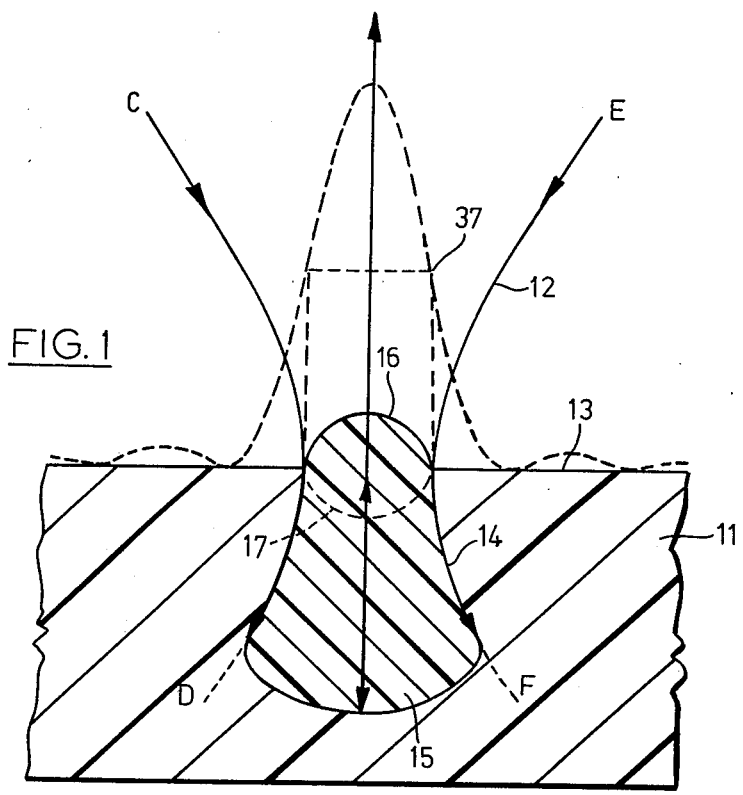
FIG. 1 is a representation of a high resolution transmission electron microscope photograph of a thin vertical section through a layer of a recording medium formed with a localised change in surface curvature in the form of a bump.

Referring to FIG. 1, a layer 11 comprises a recording medium that is a solid having first and second states associated with different respective specific volumes (it may be noted that the specific volume of a material is the inverse of its density). The medium 11 is selectively producible in either of said states by melting the medium and cooling it from the molten state at a selected rate of cooling. Reference numeral 12 indicates the boundaries of a laser beam that is focused on the optically smooth and homogeneous surface 13 of the recording medium 11. By "optically smooth and homogeneous" is meant that the surface 13 does not exhibit any irregularities in contour of its surface, or any particulate or other inclusions such as grains of pigment, etc., distributed within the material itself such as would interfere with distinguishing optically between the smooth unrecorded surface 13 of the medium and the raised or depressed recording pits and bumps that are created on said surface in accordance with the techniques of the present invention.

The laser beam 12 is focused to a spot of light of the smallest-possible diameter coincident with the surface 13 of the recording medium 11. The smallest size of spot that can be achieved is limited, for a laser beam of given wavelength, by the laws of diffraction to a certain size that is dependent on said wavelength, and this smallest-possible sized spot is accordingly referred to as the "diffraction-limited spot". It will be noted that in practice the sides 12 of the laser beam near its region of minimum diameter at the surface 13 are not straight, but form a curved, waisted configuration. Likewise, in the portion 14 of the beam below the surface 13, the sides of the laser beam are also curved, as shown in FIG. 1.

In operation, the smooth-surfaced layer of the recording medium 11 is pulsed with the focused laser beam 12 to inject a quantity of laser radiation of sufficient intensity to heat to the melting temperature the small volume of material within the medium 11 that is irradiated by the beam. The volume 15 of the medium 11 that is heated by the laser beam, as defined by the beam 14 where it passes through the medium 11, can be made very small. Typically, the diameter of the spot that is melted at the surface 13 will be less than about 0.65 $\mu$m (0.65 micron), and the duration of the pulse of heating will be of the order of 100 nanoseconds. Owing to the minuteness of the irradiated volume, and because of the sharply-defined characteristics of the laser beam, the amount of heat that is injected into the melted volume 15, and the temperature that it attains, can be closely controlled. Once the pulse of radiation has terminated, the melted volume begins to cool at a rate of cooling that is closely dependent on the temperature to which the melted material is raised. If the material is raised to barely above the melting temperature, the surrounding recording medium in the layer 11 remains relatively cool, and on removal of the laser radiation the melted volume 15 will cool rapidly, whereas if the melted volume 15 is raised to a higher temperature, the surrounding medium will also correspondingly be heated, so that a slower rate of cooling will result when the laser radiation is removed. In this manner, the rate of cooling from the molten state can be controlled, so that it is possible to selectively produce on solidification of the melted volume either the first or the second of the different specific volume states in which the medium 11 is capable of existing.

Moreover, it will be noted that, with materials that are capable of undergoing the above-described thermally-induced transition, once a mark, e.g. a pit or a bump, has been produced on the surface of the recording medium, the mark can if desired be erased by exposing it to radiation of intensity such that the previously melted volume is re-melted and raised to a temperature from which, owing to the temperature to which the surrounding medium is thereby raised, the material will cool at a rate such that it is restored, at least mainly, to its original specific volume, whereupon there is no longer as great a discrepancy between the specific volume of the re-solidified volume and of the surrounding mass of recording medium and therefore no longer as pronounced a discontinuity as formerly at the surface of the recording medium.

Where, in the course of making a recording, the medium is converted from a state of lower specific volume to a state of higher specific volume, as the melted volume 15 is confined on the sides and at the bottom by the unmelted residue of the recording medium 11, the increase in volume results in a quantity of the melted material being extruded upwardly through the opening that is melted at the surface 13 of the recording medium, so as to form a raised, curved bump 16 that is left upstanding above the general plane of the surface 13 when the material has cooled.

The edges of the bump 16 provide a crisp discontinuity from the plane of the surface 13. The manner of formation of the bump 16 is somewhat analogous to the manner in which an upward protrusion of frozen milk is obtained above the neck of a milk bottle when the contents are frozen. It will be noted that this "milk-bottle effect" is enhanced, and the height of the bump is increased, when the diameter of the spot that is melted at the surface of the material 13, and hence the diameter of the neck through which the molten material is extruded upwardly, is made as small as possible in relation to the volume of material that is melted within the layer of recording medium 11.

It is therefore advantageous that the beam should be brought to focus preferably at a diffraction-limited spot, coincident with the surface 13 of the recording medium 11, so that a spot of minimum diameter is melted at the surface 13.

In order to permit the recorded mark to be readily distinguished from the background flat surface 13 by optical means, it is desirable that the aspect ratio of the bump 16 should be at least 1:10 i.e. the vertical extent of the bump in comparison with its width should be at least 1:10, preferably at least about 1:5 and more preferably about 1:2.

For the ideal condition in which the diffraction-limited spot is coincident with the surface 13 of the layer 11, the aspect ratio of the bump that is obtained is dependent on three factors. Firstly, the aspect ratio will increase as the angle of convergence of the incoming beam 12 increases. There are, however, practical limits to the greatest value of numerical aperture that can be used with a laser recorder. In practice, the largest value of numerical aperture that can be used is about 0.85, corresponding to an angle of convergence $\alpha$, as indicated in FIG. 1 of about 116°.

Secondly, the aspect ratio of the bump increases with increase in the change in specific volume that occurs on transition between the original and the changed states of the recording medium. It is useful to refer to the change in specific volume in terms of the percentage specific volume change dV, which is defined as $$dV = (V_1/V_2) \times 100$$

wherein $V_1$ is the magnitude of the difference in specific volume between said first and second states of differing specific volume, and $V_2$ is the original specific volume of said medium 11.

Thirdly, the aspect ratio of the bump increases with increase in the volume 15 of melted medium, and this in turn is dependent on the depth of the volume 15 which is melted by the laser beam. The depth to which the medium can be melted is dictated by the transparency of transmissivity of the medium with respect to the particular laser radiation that is employed. It may be noted that the transparency of transmissivity varies with changes in wavelength, but for radiation of a given wavelength, the transmissivity of the medium with respect to the laser radiation is indicated by the formula $$P(x) = P_0 e^{-x/L}$$

wherein $P_0$ is the power or intensity of the laser radiation at the surface 13, $P(x)$ is the power at depth x below the surface, and L is the distance at which the power of the beam has fallen to (1/e) (36.8%) of its value at the surface. The value L, which is termed the 1/e attenuation length of the material, is a constant for any given recording medium and for laser radiation of a given wavelength, and in practice it is found that it approximately indicates the depth to which a given recording medium may be melted by radiation of a given wavelength.

Accordingly, in order to achieve a bump of aspect ratio of at least 1:10 through the use of a focused laser beam, a medium should be employed that is characterised by the product $dV \cdot L$ attaining at least a certain value. From considerations of the geometry of the pear-shaped volume 15 of melted material as indicated in FIG. 1, it can readily be calculated that the product $dV \cdot L$ must have a value of at least about 2 $\mu$m, where L is measured in microns. Although in theory there need be no upper limit to the maximum value of the product $dV \cdot L$, the maximum percentage specific volume change that may be encountered in practice is unlikely to exceed about 50%, and for reasons discussed in more detail below, it is undesirable that the attenuation length L should exceed about 3 $\mu$m. Accordingly, in practice the maximum value of $dV \cdot L$ should not exceed about 150 $\mu$m. Desirably, the product $dV \cdot L$ is at least about 4 $\mu$m. In the presently preferred form of the invention, said product is about 7 $\mu$m.

The above discussion has dealt mainly with layers of recording media that are capable of undergoing an increase in specific volume, that is, a decrease in density. The present recording process is, however, also applicable to layers of recording media that are capable of undergoing a decrease in specific volume on melting and cooling at a selected rate. In such case, there is injected the required amount of energy into the melted volume 15 such that, on termination of the laser radiation pulse, the melted volume cools at a rate of cooling selected to achieve a transition to its other physical state. There is thereupon produced a corresponding decrease in volume of the melted zone 15, so that a depressed pit, as indicated in broken lines by reference numeral 17 in FIG. 1 is obtained. As with the procedure for producing raised bumps discussed above, on adjustment of the intensity of the pulse of laser radiation injected into the recording medium, the depressed area can be re-melted and raised to a temperature such that a rate of cooling is achieved which results in the re-melted volume solidifying back to its original state of specific volume, so that the pit is erased and the surface of the medium is restored to its original smooth condition.

In selecting materials to be used as recording media in the process of the invention, conventional techniques for measurement of 1/e attenuation length may be adapted for the measurement of the small values of 1/e attenuation length, $L\mu m$, that are desirable. For example, thin films may be made from the materials to be tested, the films tapering in thickness towards one edge, so that measurements of the variation in transmissivity of the medium with variation in thickness of the film may be made directly. Further, in the case of proposed recording media that can be brought into solution in an appropriate solvent, measurements can be made of the absorption of the laser radiation by solutions of varying concentration, whereby a value corresponding to the 1/e attenuation length of the pure solid may be obtained by extrapolation.

The desired recording media that meet the requirements of relatively short attenuation length with respect to laser light and of having an optically smooth and homogeneous surface, will normally have a black, glossy appearance, and all such materials are prima facie candidates for use as recording media for the process of the invention.

The capacity of a given material to exist in two different states of specific volume, between which the material is switchable by melting and cooling at a selected rate, can most conveniently be investigaged by probing the material with a laser beam stylus, e.g. using a laser beam pulsed at pulses of duration of the order of 100 nanoseconds and of controllable intensity, with said laser beam being focused to a diffraction-limited spot at the surface of the proposed recording medium, or by any other method that is capable of transiently melting a small volume of the medium to be tested and permitting it to cool under conditions such that the melted material is rapidly, quenched or is more slowly cooled. It is for example possible to investigate thermally-inducible changes in specific volume on small specimens of the proposed recording medium by melting them and subjecting them to different rates of cooling e.g. by permitting the molten material to cool slowly by exposure to the ambient temperature or by quenching the molten sample by plunging into a bath of a suitable inert coolant liquid such as cold water, and then observing any changes in the specific volume.

The preferred recording medium amongst those investigated up to the present time is a film of a commercially available sealant wax that is a glossy black solid material available from Shell International Chemicals Co. Ltd., London, England SE1 7PG, under the trade mark APIEZON W. The physical properties of APIEZON W as made available by its manufacturer are set out in the Table below. Films of this material can be prepared by coating a substrate with a solution of the APIEZON W material in an organic solvent e.g. toluene, or trichloroethane, and permitting the solvent to evaporate. Desirably, the solution is made up as a highly viscous, concentrated solution of the APIEZON W in the solvent, as these concentrated solutions yield films with better recording properties. Films made from these concentrated solutions provide an excellent recording medium of which small volumes can readily be melted and switched to a state of increased specific volume on application of a pulsed laser stylus thereto. Thus, the material can be rapidly melted and quenched and bumps of raised surface relief can be obtained on the surface of the recording medium.

TABLE

| | |
|---|---|
| Approximate Softening Point, °C. | 85 |
| Temperature for Application, °C. | 100 |
| Vapour Pressure at 20° C., torr | $10^{-8}$ |
| Vapour Pressure at 100° C., torr | $5 \times 10^{-6}$ |
| Specific Gravity at 20° C./15.5° C. | 1.055 |
| Specific Gravity at 30° C./15.5° C. | 1.048 |
| Average Molecular Weight | 1214 |
| Coefficient of Volume Expansion per °C., over 20° C.–30° C. | $6.2 \times 10^{-4}$ |
| Thermal Conductivity, BTu.in./ft$^2$h,F | 1.31 |
| w/m °C. | 0.189 |
| Specific Heat at 25° C., cal/g | 0.43 |
| joule/g | 1.8 |
| Loss Tangent | 0.015 |
| Permittivity | 2.8 |
| Volume Resistivity, ohm cms | $6.31 \times 10^{15}$ |

On re-melting the raised relief portions of the recording medium, using a laser beam of higher intensity, the bumps can be flattened out, and the recording thereby erased, as the melted material thereupon cools at a slower rate so that it is restored to its original state of lower specific volume.

It is suggested that these changes in specific volume are associated with changes from a crystalline state corresponding to a lower specific volume to an amorphous state corresponding to an increased specific volume, and that on melting and rapid cooling or quenching the amorphous state is produced whereas in slower cooling the melted material re-crystallizes and the original higher density, lower specific volume crystalline state is achieved. When attempts are made to make a recording on the bulk APIEZON W material, permanent bumps cannot be obtained, as the bumps fade away after a few seconds. It is suggested that by preparing coatings of the material from solution thereof, a fractionation of the material occurs so that a more highly crystalline layer at the surface of the deposited coating is obtained that exhibits a sharp melting point thus permitting rapid melting and quenching.

In any event, it is found that when a recording is made on a film of the APIEZON W material deposited from a solution, as illustrated in the representation of FIG. 1 the pear-shaped melted volume 15 indicated in FIG. 1 exhibits in the transmission electron micrograph a lighter appearance than the surrounding darker unmelted regions, and this is indicative of a lower density, higher specific volume state. Although the crystallinity of APIEZON W wax does not appear to have been previously reported, transmission electron micrographs through thin sections of the material present an appearance that is indicative of the presence of a fine microcrystallite grain structure, with the grain sizes being small in comparison to the wavelength of light, and thus not interfering with the optical smoothness of the surface of the medium. Moreover, the zones of the medium that have been subjected to the recording process and have been switched to a state of increased specific volume are physically less brittle than the unchanged zones, indicating a transition to the more resilient condition that is associated with the amorphous state.

Tests conducted on the preferred APIEZON W material show that with respect to laser light obtainable from a typical laser source, e.g. a blue emission at a wavelength of 4880 Å as obtained from an argon ion laser, the APIEZON W material exhibits a 1/e attenuation length of about 1.0 µm. On transition from its lower to its higher specific volume state, there is a percentage specific volume change dV as defined above of about 7%, so that the above-discussed product dV.L has a value of about 7 µm.

A further example of a recording medium that is capable of forming raised recording marks in the form of bumps when exposed to a laser beam stylus is the shiny black residue of caramelized sugar that is obtainable by heating sucrose for prolonged periods. As with the APIEZON W material, on exposure to a pulse of laser light of relatively low intensity, a raised bump-like mark can be made, and on exposure of the bump to a pulse of higher intensity the bump can be flattened out and the recording can thereby be erased. The response of caramelized sugar is however much inferior, as the height of the bumps that can be formed is much lower and therefore this material is not preferred.

An example of a material that is capable of undergoing a reduction in specific volume on heating with a laser beam stylus, so that depressed pits as indicated by the broken line 17 in FIG. 1 are obtained, is a cured epoxy resin material blackened by doping with iodine. This material is obtained by mixing a conventional two-part epoxy resin adhesive pack e.g. LEPAGE'S two-component epoxy resin material to obtain a cured epoxy resin film. The film is then left in contact with iodine vapor e.g. by leaving the film in a sealed enclosure into which crystals of iodine have been introduced, until the film absorbs sufficient of the vapor to render it black. On exposure of the surface of this film to pulses (duration 100 to 200 nanoseconds) of blue laser light (wavelength 4880 Å) focused to a diffraction limited spot on the surface of the film, at an intensity of about 2 to 3 mW at the surface of the film, a recording in the form of craterlike depressed pits can be produced on the surface of the film. The recorded information can be reproduced by sweeping the spot of light along the surface of the film over the pits, operating the laser continuously at a lower level of intensity (e.g. about 300 µW). A pulsed reflection from the surface of the film is obtained. The recording can be erased by sweeping the said diffraction-limited spot of light along the recording, operating the laser continuously with the intensity of said spot being about 3 mW. After erasure, a pulsed reflection is no longer obtained when a spot of low intensity laser light is swept along the track of the former recording.

Apart from recording media that can be selectively switched between amorphous and crystalline states, there exist other materials that can undergo a change in specific volume on exposure to a selected regime of heating. For example certain materials can be made to undergo changes in density on quenching and on heating at annealing temperatures, even though the material remains in the amorphous state, and such materials that can be selectively switched between different states of density or specific volume though injection of controlled amounts of heat energy into a confined volume of the material, using a laser stylus, are employable in the recording process of the invention. For further description of variable density amorphous materials, reference should be made to Turnbull et al. "Structure of Amorphous Semiconductors" J. Non-Crystalline Solids vol 8-10, pp. 19-35, 1972.

The presently preferred recording media are, however, materials that undergo a transition between crystalline and amorphous states accompanied by a large increase in specific volume. The desirable properties of the preferred recording media for use in the present invention will now be discussed with reference to materials that are originally in a state of low specific volume (high density) and that can be switched to a higher specific volume state, leading to the production of a bump, but it will be appreciated that similar principles apply also to materials used in recording processes where there is a decrease in specific volume, leading to production of a depressed pit in the recording medium surface.

In the preferred materials, the glass transition temperature, $T_g$, should be well above room temperature so that the amorphous low density state will be stable and permanent under the full range of ambient temperatures. Preferably $T_g$ should not be much lower than about 90° C.

Moreover, the thermal conductivity (or equivalently, the thermal "diffusivity") should be low for a number of important reasons: it prevents the lateral spread of thermal energy during the bump forming process, allowing high resolution recording; it reduces to economical levels the threshold power levels for writing and erasing; and it makes the local cooling time sensitive to the amount of injected heat so that either quenching (recording) or annealing (erasing) can be thermally initiated.

Desirably the thermal conductivity is less than about 5 mW/cm°K., more preferably less than about 3 mW/cm°K.

The characteristic annealing time should be short so that a volume of melted material less than a cubic micron in size will approach its maximum density within a few microseconds. This is a requirement for fast thermal reversibility. Further, in order to achieve good sensitivity, the melting process should call for as little heat as possible from the recording laser. So for thermal efficiency a number of requirements must be met. In the case of a crystalline material, it is necessary to heat the substance beyond the glass transition temperature of the amorphous phase to the true thermodynamic melting temperature, $T_m$, in order to achieve complete amorphization on quenching. This is because the last traces of crystallinity do not disappear until the melting temperature is reached. Therefore, the melting temperature should not be excessively high. However, in order for crystallization to be kinetically favored during the annealing process, $T_g$ and $T_m$ should be separated by several tens of degrees. Therefore, if $T_g$ is around 100° C., say, $T_m$ should be at least 150° C. The two major factors governing how much heat is required to achieve melting are the specific heat capacity and the latent heat of fusion. Thus, it is desirable to select materials in which these two values are low. The material should also have a sharply defined melting temperature in the crystalline state and a relatively well defined softening temperature in the glassy or amorphous state.

The optical attenuation length of the material for the chosen laser wavelength should be long enough to permit a depth of penetration sufficient to produce the net volume expansion required to yield an easily detectable bump having an aspect ratio of at least 1:10 at the surface. To produce a playback signal with high contrast, using a playback beam focused to a diffraction-limited (i.e. wavelength-sized) spot, the height and width of the bump should be comparable with the wavelength of said playback beam. As discussed earlier, if the material undergoes a relatively large percentage specific volume change or expansion on quenching, the depth of penetration required to produce the desired total expansion will be proportionately less. For example, for efficient high relief recording with blue light at a wavelength of $\lambda = 4880$ Å, the attenuation length should preferably be about one micrometer where the percentage specific volume change is about 5 to 10 percent. In the preferred form, wherein the laser beam is focused to a diffraction limited spot at the surface of the recording medium, the $1/e$ attenuation length will normally be in the range of about 1/10th to about twice the width of the area that is melted at the surface of the recording medium. At lower attenuation lengths it is unlikely that sufficient material is melted to provide a bump of adequately pronounced aspect ratio, and at longer attenuation lengths an excessively large volume of the medium is heated and a pulse of light of very high intensity is required to melt the recording medium. Owing to the high costs of laser power this increases the costs of the recording process beyond acceptable levels. Preferably, the $1/e$ attenuation length is about ½ to twice the width of the spot melted at the surface, and in the presently preferred form the $1/e$ attenuation length is about twice the value of said width.

In addition to the thermal, morphological, and optical properties mentioned above, the preferred materials should facilitate the fabrication of large area recording media of optical smoothness and homogeneity without resort to expensive processes such as vacuum deposition.

Figure 2:
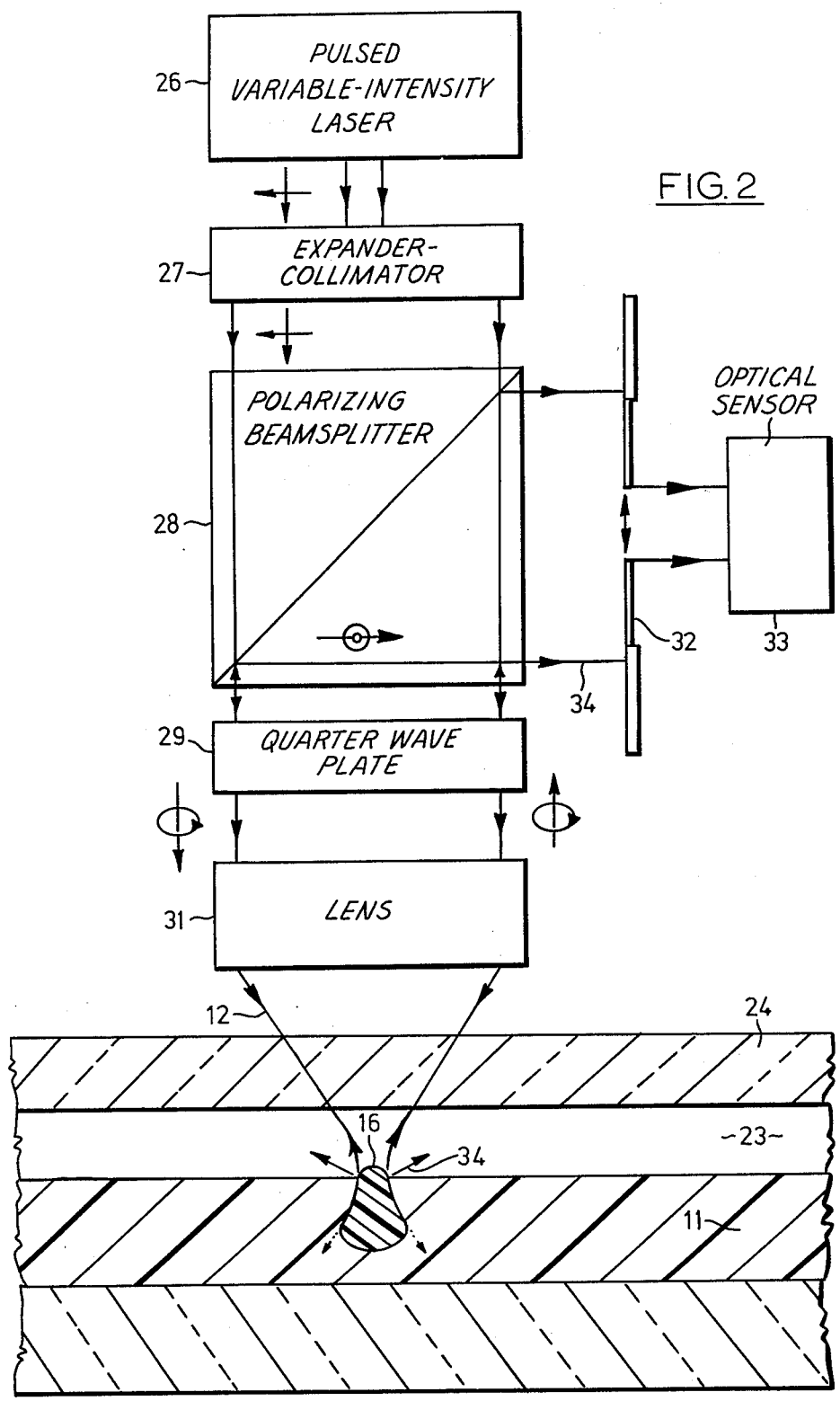
FIG. 2 shows in diagrammatic form one example of recording and play-back apparatus in accordance with the invention.

The laser recording process and the apparatus used for recording and playback are illustrated in more detail in FIG. 2.

Specifically, a target 21 comprises any convenient stiff or flexible substrate 22 having deposited thereon the layer 11 of recording medium, a transparent elastic compressible layer 23 e.g. of air or a solid compressible layer e.g. of clear silicone rubber, and a hard transparent dust cover 24 e.g. a glass cover plate. The laser beam input-output apparatus comprises a source of polarized continuous wave or pulsed laser light 26, of variable intensity, an expander-collimator 27, a polarizing beamsplitter 28, a quarter-wave plate 29, a high numerical aperture (e.g. 0.65) microscope objective lens 31, a movable and variable-aperture iris diaphragm 32 that serves as a spatial filter, and an optical detector 33. These elements serve to generate and focus the beam of laser light 12 at target 21 and to collect various amounts of the back-reflected light indicated by arrows 34 and direct it to the detection system 32, 33. The states of polarization of the laser radiation from the source 26, and of the incident and reflected beams are indicated by the conventional notation in FIG. 2.

The incident focused laser beam penetrates the surface of the recording medium 11 and is absorbed within a depth which is typically two optical wavelengths. This penetrating laser beam is converted to heat which warms the medium 11 and can bring about localized melting if its power density is higher than a certain threshold value.

During an initial writing operation the intensity of the laser beam 12 is briefly (e.g. for 100 nsec) pulsed above the aforementioned melting threshold to cause localized melting at selected bit sites within the recording medium layer 11 of the target 21. The localized melting serves to amorphise tiny pockets of the layer 11 forming in the case of bump-formation less dense amorphous regions such as the amorphous volume 15. Because of the mechanical restraint imposed by the surrounding unmelted material 11, the reduction in density in the amorphous region 15 is expressed as a crisply-defined bump 16 at the surface of the layer 11, or as a crisply-defined pit in the case of materials that undergo a decrease in specific volume.

During the reading operation, the intensity of the laser beam is reduced below the melting threshold of the recording material, and either the beam or the target 21 is moved so that the surface of layer 11 is scanned by the spot of focused laser light. As the playback spot moves over the recording surface, about 7% of the incident light is reflected back up to the lens and is directed by the beamsplitter 28 to the optical detector 33 which measures the intensity of the back-reflected light. If the beam falls on a flat area, all of the reflected light is collected by the lens 31 and directed to the detector 33 which measures a relatively high intensity. But, if the beam falls on a bump 16, or on a pit with a downwardly-recessed curved surface, the high localized curvature of the dome-like surface of the bump or of the crater-like surface of the pit acts to spread the back-reflected light 34 over a much wider angle than that subtended by the aperture of the lens 31. Thus, most of the back-reflected light falls outside the lens aperture, and the detector 33 measures a much reduced intensity. As the playback spot is scanned over the recording surface, a sudden dip in the back-reflected intensity signals the presence of a bump, or pit, equivalent to one bit of information.

One can substantially increase the amplitudes of these dips by using a variable aperture iris 32 placed between the lens 31 and the detector 33. It is a characteristic of the response yielded by the reflection of light from the aforesaid bumps or pits that there is a small portion of the back-reflected beam pattern 34 that undergoes a larger change of intensity than the rest of the pattern when a bump or pit moves into the scanning spot. By mounting a variable size aperture iris 32 in a mechanical arrangement which allows its position to be adjusted in a plane perpendicular to the back-reflected beam, and by optimizing the position and size of the aperture, it is possible to select that portion of the beam which is most highly modulated as the scanning spot moves across the bump or pit. This method achieves an improvement of typically a factor or two or three in the output signal contrast, and when the recording power level is set well above the recording threshold, this technique can easily yield an output signal whose depth of modulation approaches 100%. That is, when the aperture 32 is properly adjusted, the presence of a bump will reduce the intensity seen by the detector 33 to the level it would see if the laser beam were turned off. The use of an adjustable spatial filter such as the iris 32 is believed novel, and leads to a level of playback signal contrast unsurpassed in the prior art.

In the case of materials that form a raised bump during recording, erasing is accomplished by raising the intensity of the laser beam 12 about a factor of two above the threshold for recording, and scanning the spot over the selected features. This measure serves to recrystallize the amorphous melted and solidified volumes 15 causing the associated bumps to flatten out. For the case where a recording surface made of APIEZON W is moved at a rate which is slow enough so that the surface does not move much during an exposing pulse, the recording threshold is typically about 1.5 mW for a 0.5 μm diameter spot of blue light (λ=4880 Å) from an argon ion laser. The threshold for erasing under similar conditions is about 3 mW.

Referring again to FIG. 1, the "boundary" of the converging laser beam is represented by the curved lines CD and EF which outlines the surface of an hyperboloid of revolution within which the intensity of the light is above the melting threshold of the recording material 11. The peaked symmetrical curve 36 represents the Airy Pattern, and indicates the relative radial intensity distribution of the beam in the vicinity of the recording surface 13. The radial position where the power density of the beam has fallen to one-half of its peak value is marked by the half-power point 37, which defines the half-power diameter of the laser beam at the recording surface. Because of the sharp melting threshold of the recording material, there is a radius beyond which melting does not take place due to the falling off of the intensity distribution at a height corresponding to the melting temperature of the recording material. As the overall intensity of the laser beam is lowered or raised, this horizontal line will shift up or down on the distribution curve respectively, the points of intersection of the line with the distribution curve marking the radial boundary of the resulting bump. Thus, by lowering the intensity of the beam to the appropriate level compared to the melting threshold, it is possible to make a bump which is narrower than the half-power spot size, and similarly, by raising the beam intensity a larger bump can be made. FIG. 1 illustrates the special case where the melting threshold corresponds to the half power point, resulting in a bump whose diameter is exactly the half-power width of the beam.

It is useful to define the "effective spot size" of the beam as the diameter (at the surface 13) of the melted zone 15. Of course, for a given material with a given melting temperature, the effective spot size will increase as the overall intensity of the beam is raised. This fact has a strong bearing on the recording process in the following way. For geometrical reasons, a smaller melted volume will cool more rapidly than a larger one. Since the amorphization process which leads to the formation of the bump 16 depends on a high rate of cooling to bring about quenching in zone 15, it follows that the effective spot size should be kept to a minimum when recording. Of course, this is in harmony with the goal of maximizing the bit packing density. Thus, the overall intensity of the laser beam should be kept below a certain critical level for best results when recording. This critical level is the threshold for erasing.

As discussed earlier, with recording media of very low thermal conductivity, it is possible to control the rate of cooling of a typical recording "cell" 15 by varying the amount of heat injected by the laser beam during the melting process. The material tends to condense at a high rate towards a stable lower specific volume state unless it is quenched at an even higher rate, in which case it freezes in a permanent metastable state of higher specific volume. The latter condition, corresponding to the process of recording, will be obtained only if the smallest possible volume is exposed (corresponding to a small effective spot size) and given just enough heat to melt the material in the volume 15. In this case the melting energy will diffuse away quickly, and quenching to the high specific volume state will occur, with the concomitant formation of a bump. However, the former condition, corresponding to the erasure process will occur if the period of cooling of a melted cell is extended by injecting an excessively large shot of heat during the melting process. The excess heat will alter the thermal boundary conditions of the cell causing the cooling period to be extended to the point that the material is able to condense to the lower specific volume, and this will cause the surface of the cell to return to its flat state. Delivering a larger injection of heat will be done by raising the intensity of the beam above the level for recording, and this will have the further effect of increasing the effective spot size somewhat. If the volume of the melted region is increased as a result of the larger spot size, the rate of cooling will be reduced by this factor as well.

It will be appreciated that with materials that are depositable as optically-smooth layers in the amorphous state, precisely the opposite recording and erasing mechanism takes place with injection of a higher quantity of heat resulting in the transition to a lower specific volume crystalline state, producing a pit-form recording mark, and the injection of a lower quantity serving to re-convert the material to the higher specific volume amorphous state, and thereby erasing the recording.

The process in which raised bumps are produced during the recording process is preferred to that in which depressed pits are formed, as it is superior from the point of view of data security in an archival memory system because it is an erase-rewrite mechanism in which the erase operation requires at least as much power density as the recording operation. This provides the maximum margin of safety against accidental erasure by the lower powered read beam. In contrast, with recording processes that involve pit-formation, erasing is accomplished by exposing recorded areas to a continuous laser beam intensity above the level used for playback but substantially below that required for recording. Thus, in any memory system based on this latter process the possibility exists that due to long term drift or system faults, the intensity of the playback beam might wander upward to the erase threshold and cause a catastrophic loss of data files.

The preferred form of the present invention in which bumps are formed on the recording medium exhibits the remarkable feature that erasing must be done at a power level that is higher than that required for bare threshold recording and equal to that for peak amplitude recording. Furthermore, the erase process is purely thermal, so that the erase rate is limited only by the power available from the laser.

Figure 3:
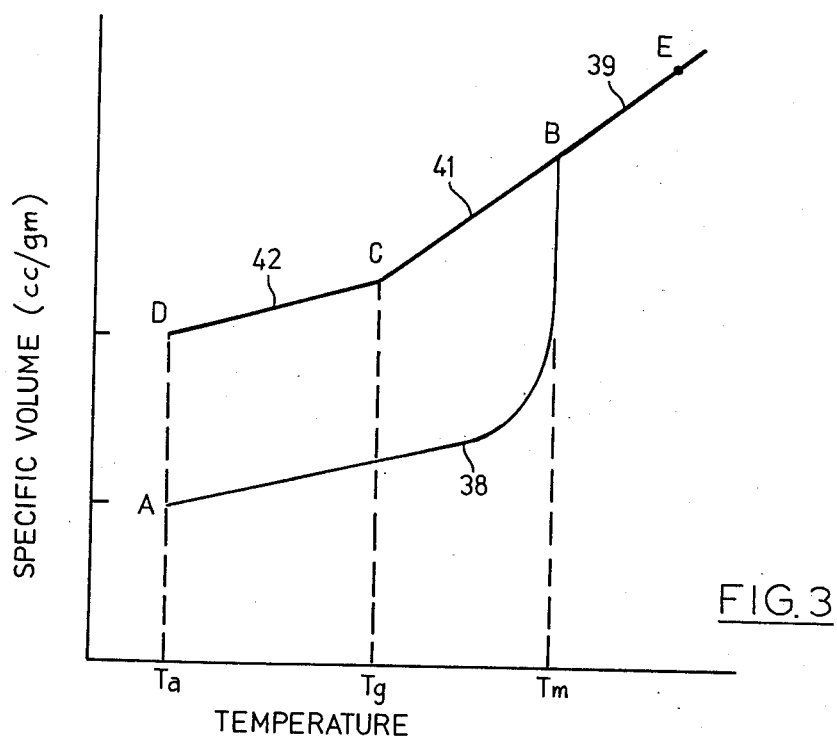
FIG. 3 is a graph illustrating the relationship between temperature and specific volume for various morphological states of a typical solid recording medium.

Referring to FIG. 3, this illustrates the variation of specific volume with temperature for a preferred recording medium that undergoes a crystalline to amorphous transformation. Point A represents the pre-recording operating point of the recording material in its low specific volume (high density) (e.g. crystalline) state at the ambient temperature $T_a$. In the process of recording, a pulse of light injects just enough heat to push the operating point along the melting curve 38 to the point B, or to a point a little way up the segment 39, which indicates the liquidus. This action brings about rapid melting in the chosen recording cell 15.

At the end of the light pulse, rapid cooling or quenching causes the operating point to move along curve 41 from B to C at the glass transition temperature $T_g$, and along curve 42 to the point D. As the temperature of the cell falls below $T_g$ the material freezes into a metastable amorphous state at point D. This metastable state will be permanent at the ambient temperature $T_a$ (room temperature) provided the glass transition temperature $T_g$ is far enough above $T_a$ that the material is hard and stable at $T_a$. It is clear from FIG. 3 that when the material of the cell 15 is switched from the crystalline state at A to the amorphous state at D, there is a permanent net volume expansion. This expansion, accumulated throughout the exposed volume 15, gives rise to the bump 16 as shown in FIG. 1. The process of erasure is brought about by exposing the expanded cell to a larger pulse of heat which will push the operating point from D up to some point E beyond point B on the liquidus curve 39. At the end of the pulse the operating point slides slowly back to B and then down along the crystallization curve 38 back to its original state A. The resulting net volume loss throughout the cell 15 causes the bump to recede, leaving the top of the cell approximately flush with the surrounding material. The percent volume change, from the high density state at A to the low density state at D, varies considerably from material to material, but in the case of recording media that are microcrystalline polymers the variation is typically between 5 and 10 percent.

It should be emphasized that the essence of the preferred form of recording process is in the thermally induced switching from a stable state of high density to a stable state of low density with a concomitant net volume increase which is expressed as a bump. The inverse transition, which is also thermally induced, is the basis of the erase process. The example in FIG. 1 represents one embodiment in which such a bistable density change is induced in a highly crystalline material. That is, the volume increase required for the recording process is associated with a transition from a highly ordered crystalline state, to a disordered or amorphous state. But, as was pointed out earlier, there are also materials without structural order which also exhibit such a bistable change of density. However, the highly crystalline materials are preferred as they may be expected to yield more sharply-defined bumps because of the more sharply defined melting transition of a crystalline material.

In the presently preferred example of such a crystalline material, namely the surface layer of a dip-coated film of the complex thermoplastic resinous wax known as APIEZON W, the recording surfaces are prepared simply by dissolving the material preferably in a chlorinated or aromatic solvent (e.g. toluene), then preferably filtering to remove particles of impurities, and dip-coating a convenient substrate from a concentrated viscous solution of the material. The coating-operation should be carried out in a clean, dry environment, such as an enclosure flushed with dry nitrogen, and after drying, the surface should be sealed with a clear protective cover or layer to prevent contamination of the surface by dust particles from the air. It is believed that as the coating dries, a separation effect occurs which causes one of the fractions of the material to form a layer at the surface which is highly crystalline, consisting of crystallites much smaller than the optical wavelength. This smooth microcrystalline layer forms the active medium of the memory.

As long as the thickness of the recording layer 11 is greater than the required depth of material to be melted for producing a detectable bump of aspect ratio of at least 1:10, the thickness of the layer is not important, unless it is desired to enhance the cooling rate of the melted volume 15 by using a high thermal conductivity substrate as a heat sink. This measure would be required if it is desired to record using a large spot (for example, a 1 $\mu$m spot from a diode laser) on a material such as APIEZON W, which gives its best response for a spot size less than 0.7 $\mu$m. In this case, the active layer 11 should be no thicker than the depth of a recording cell 15, so that the bottoms of the cells 15 are in good thermal contact with the substrate. However, since the depth of a cell could vary by about 20 or 30 percent from the preferred depth of about 1 $\mu$m without significantly affecting the response, the thickness of this thinner layer does not have to be stringently controlled.

Figure 4:
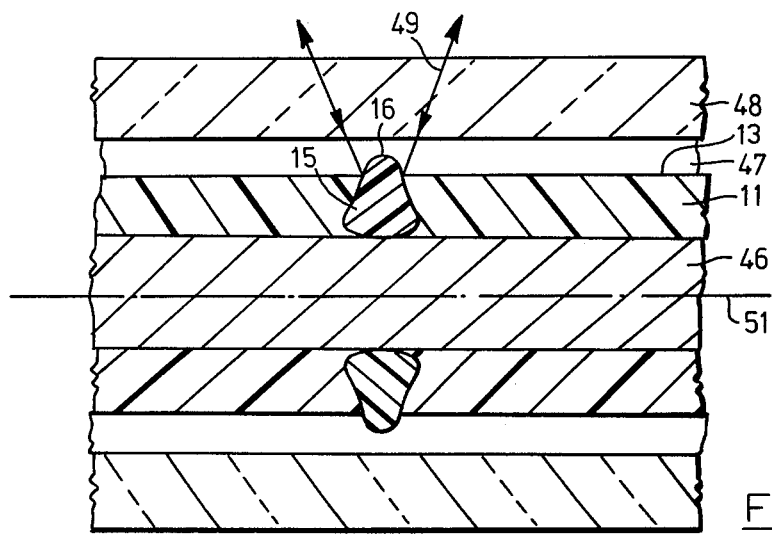
FIGS. 4 through 8 are vertical sections through five different arrangements of recording medium layers employable in the process of the present invention.

FIG. 4 shows a configuration for a recording medium with an enhanced quench rate. It should be noted that in this and the other figures wherein like reference numerals indicate like parts, the thicknesses of the various layers are not to scale; only relative thickness is indicated. In this example an active layer 11 of recording medium is coated on a material 45 of high thermal conductivity (such as a metal) which forms the combination substrate and heat sink. If the active layer were APIEZON W or an equivalent material, being switched with a diffraction-limited spot of blue light, the thickness of this layer should be for example about one micrometer, as this allows the bottom of a recording cell 15 to make thermal contact with the heat sink 46. The thickness of the heat sink 46 may be any convenient value. Immediately above the active layer is a compressible, elastic layer 47 (such as air, or transparent silicone rubber) which must be thick enough that its compression does not hamper the upward expansion of a bump 16. If this expansion causes a sufficient buildup of stress in layer 47, the resulting downward force on the surface of the bump can cause it to gradually relax back to the flat state. Since in appropriate recording media 11 the metastable state is virtually permanent until the material is re-melted, in some materials with suitably stable metastable states, but which have long erase times the downward return force exerted by layer 47 on the bump 16 might enhance the erasure process, without significantly affecting the lifetime of the recording.

On top of layers 11 and 47, there is a hard transparent protective layer 48 which must be thick enough that dust particles falling on its surface are well out of focus for the input-output laser beam 49. In this case the dust will not significantly affect the signal to noise level of the system. Layer 48 needs to be regarded as part of the optics of the input-output system because it must be used with a microscope objective lens 31 which has been specifically compensated to allow diffraction-limited focusing on the active surface 13 with the dust cover 48 in place. For high numerical aperture objective lenses 31, the thickness of layer 48 needs to be regulated to within about one percent over the entire active surface of the recording medium. The need for a dust cover of well regulated thickness is a common requirement of known laser recording systems which are designed to operate under normal ambient conditions, and the manufacture of such materials is well within the capabilities of those skilled in the art. A further important function of layer 48 and of the compressible layer 47 is to seal off the active surface 13 from oxidative or corrosive chemicals such as oxygen which might degrade the recording medium 11. The system used in FIG. 4 is a top-side reflective playback system. That is, information is played back by reflecting light 49 from the top surface of the active medium 11. The reflectance being detected is, in mathematical terms, the disturbed phase reflectance associated with each bump 16. In order for there to be a detectable phase disturbance, it will be appreciated there must be an appreciable refractive index difference between the layer 11 and the adjacent layer 47. In the example illustrated, dotted center line 51 represents the plane of symmetry of the recording medium. That is, it is double sided.

Figure 5:
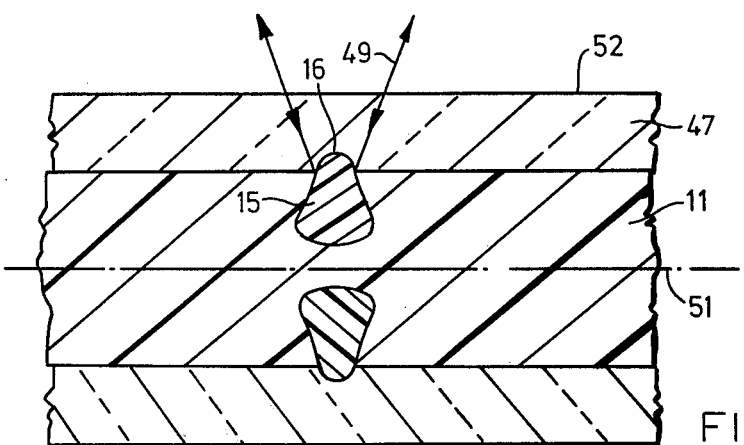

FIG. 5 illustrates a simplified form of recording medium in which the recording material 11 acts as its own substrate, and that a clear compressible material such as silicone rubber is used as the optically compensated dust protector 47. A material for layer 47 may be chosen so that its top surface 52 can be toughened by inducing molecular crosslinking, rendering it more resistant to damage. Again, this example illustrates a double-sided top surface reflective playback system, having a plane of symmetry 51.

Figure 6:
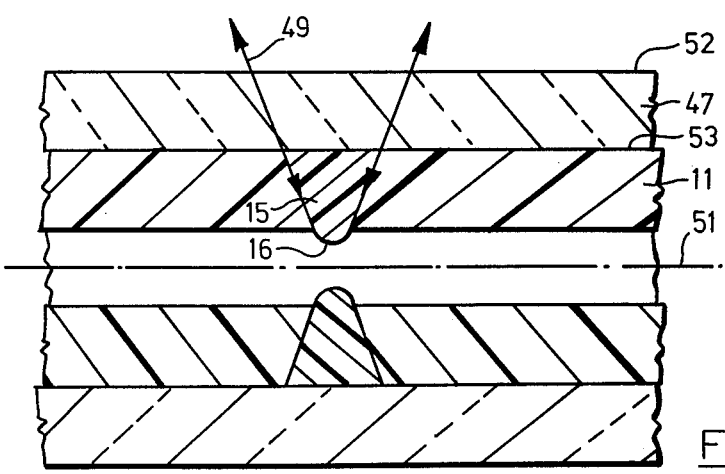

FIG. 6 illustrates a double-sided bottom-surface reflective play-back system. In this case, recording is done by focusing the laser beam 49 through the active layer 11 to the active surface 13 which is at the bottom of the active layer 11. The bump 16 expands downward into the compressible layer 47. The layer 11 in this case must be about one cell-depth thick, with reference to the cell 15. That is, it should be thick enough to absorb an appreciable portion of the incident laser light so that melting can occur throughout volume of the cell 15, but not thick enough that an excessively large volume of material must be melted, as would reduce the sensitivity of the medium. Also, if layer 11 is too thick, light reflecting back from the interface 13 would be absorbed before it could return to the detector. The particular configuration of FIG. 6 has the disadvantage that the switching effect causes a slight reduction of the refractive index in the volume 15 compared to the surrounding layer 11. As the laser beam scans along through the active medium 11, this slight index change at the top of the cell 15 will be detected as a low amplitude pulse that is longer in duration superimposed on shorter-duration pulse associated with the bump 16. That is, a low frequency low amplitude noise signal is produced by reflection at the interface 53. In FIG. 6, both the clear protective layer 49 and the compressible layer 47 act as heat sinks to aid the recording process, especially where their thermal conductivities are appreciably higher than that of recording medium 11. In a double-sided medium provision can be made so that the light transmitted through recording medium 11 does not affect the active layer of recording medium on the opposite side of the plane of symmetry 51. This may be done by making compressible layer 47 opaque by dyeing or doping.

Figure 7:
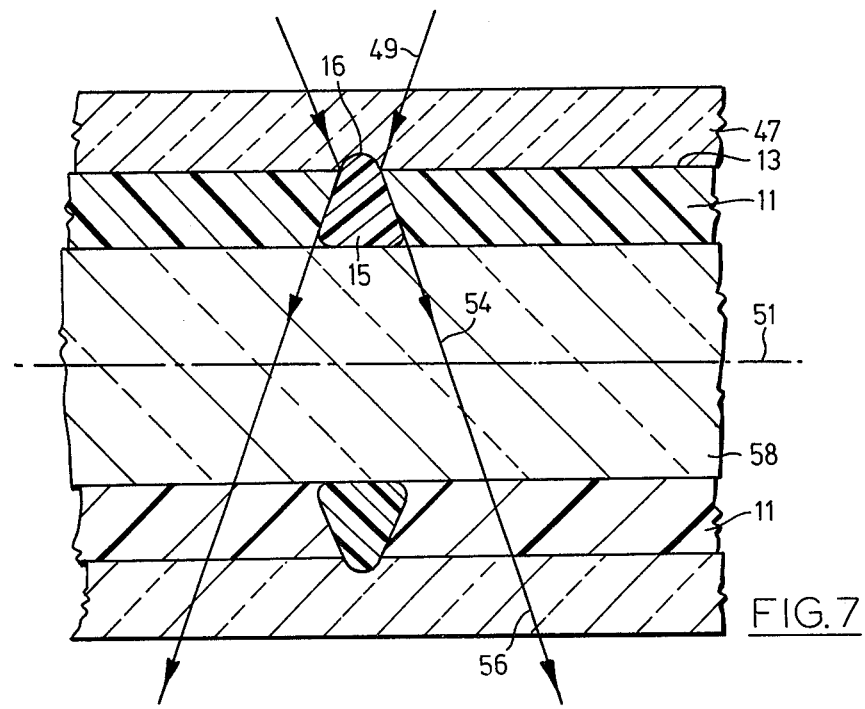

FIG. 7 shows an example of a double-sided transmissive playback recording medium. In this case the active layer 11 is made the depth of one cell 15 thick (one attenuation length) and the recording beam 49 brings about switching in the volume 15 so that a bump is pushed up into the optically compensated compressible layer 47. Thus, the active recording surface is the interface 13. But instead of detecting the presence of a bump 16 by reflecting light off the top of it, use is made of the fact that the curvature associated with the surface of the bump 16 causes an equally detectable perturbation in the distribution of light transmitted through the recorded volume 15. That is, the bump 16 scatters transmitted light as well as reflected light. During playback, the transmitted light 54 will pass through the other recording medium layer 11 and out to the detector. If both recording layers 11 are one attenuation length thick then the intensity of the transmitted beam 56 will be reduced to approximately 14% of the intensity of the incident beam 49. As is indicated by the consideration that the top-surface reflective system shown in FIG. 4 may be adequate with only the 7% Fresnel reflection returning from the active surface 13, the above 14% transmission is ample for detection purposes. So as not to interfere with the playback of recordings in recording medium layer 11, the clear spacing layer 58 is made thick enough so that the other active recording medium layer 11 is well out of focus when the playback beam 49 is focused on the active surface 13. The recorded features such as bump 16 do not then significantly perturb the outgoing beam 56. With the configuration of FIG. 7, the recording beam 49 causes memory switching in the particular active layer 11 on which it is focused. This has the disadvantage that accidental misfocusing of the recording beam may damage recordings in the other active recording medium layer, but on the other hand, it makes possible two-surface recording without having to flip the recording medium, simply by refocusing the record beam.

Figure 8:
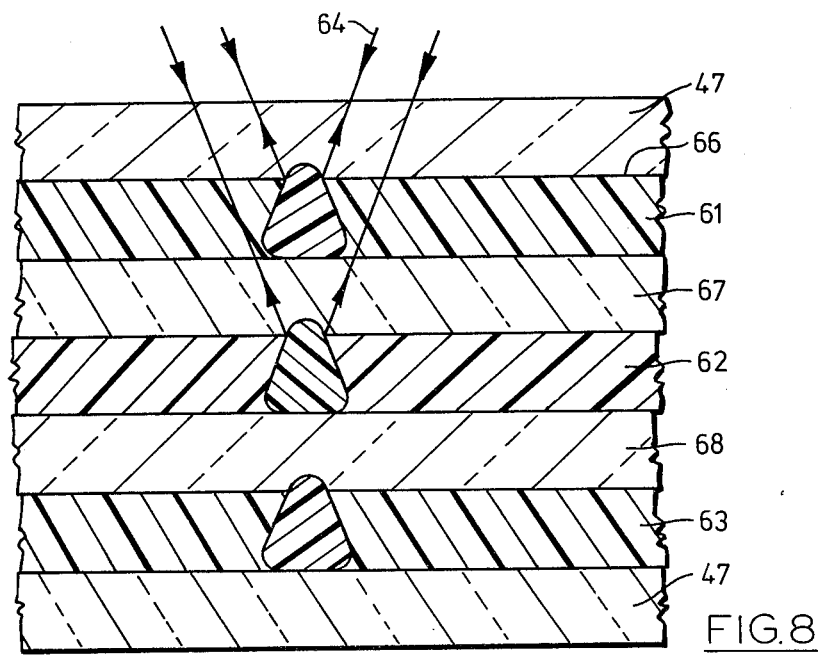

A further example of the latter kind of multiple-layer recording medium, in which reflective rather than transmissive playback is used, is shown in FIG. 8. In this example, the various active layers, 61, 62, and 63, each absorb radiation of a different colour or wavelength. This arrangement can be used to advantage with lasers such as the dye laser which can be tuned to radiate at any wavelength over a wide range. This permits the use of a recording medium such as in FIG. 8 in which a different colour of light is used to record on each of the active layers. This may be done by setting the radiating wavelength of the laser so that it falls within the narrow absorbtion band of the chosen recording layer, and focusing the laser beam on its active surface. For example, to record on layer 61, the laser beam 64 is retuned and refocused at interface 66. In order to eliminate interference from features recorded in layers above the one being probed, it is necessary to make the clear compressible separator layers 67 and 68 thick enough so that only one layer is in focus at a time. The thickness of the separators 67 and 68 should be at least several times the longest wavelength used for recording. But since visible wavelengths are less than one micrometer, the separators 67 and 68 may be thin enough that the thickness of the whole multilayered medium is relatively small so that the medium can be made flexible, if flexibility was desired. If narrow absorbtion-band dyes are used in the active layers 61, 62, and 63, the number of such layers would be limited mostly by the wavelength tuning range of the laser. In general, the maximum number of layers in this system is limited by spectral overlap between adjacent absorption bands of the various active layers as well as the total spectral emission range of the laser.

It should be noted that an important advantage of the present memory concept, in common with most other beam addressable laser recording systems, is that the active portion of the recording medium is structureless, in the sense that bit sites are not predefined by any artifacts in the structure of the film. This feature makes the memory enormously more economical on a cost per bit basis than solid state electronic systems such as the magnetic bubble memories.

Memory systems based on the present recording process must, like all known beam addressable memories, include a means to bring about relative motion between the focused spot of laser light acting as the input-output means and the surface of the recording medium. Thus, the laser beam may be left relatively fixed and the medium may be moved as in disc, drum, or tape systems, or the medium may be left relatively immobile and the bits sites accessed by scanning the laser spot over its surface.

The provision of appropriate devices for scanning the laser spot relative to the recording medium surface is well within the capabilities of those skilled in the art, and forms no part of the present invention.

Although the above disclosure provides ample information to one skilled in the art to permit the operation of a recording process in accordance with the invention, for the avoidance of doubt a detailed example of the operation of a recording process and of the apparatus used therein will now be given.

In this example, the laser 26 is a model 165/265 Argon Ion Laser from Spectra-Physics, providing a strong blue emission at $\lambda = 4880$ Å of the Argon ion laser, and having the following characteristics:
Output polarization: vertical
Beam diameter at $1/e^2$ points: 1.5 mm at 5145 Å
  Beam divergence: 0.5 milliradians
Noise rating (nominal): with power stabilizer on: 10 Hz to 2 MHz—0.2% rms typical.
Maximum power available at $\lambda = 4880$: ~1.5 watts The laser is run at a typical output power level of 10 mW so that, taking into account that losses between the laser and the recording surface, the power there will be in the vicinity of 3 mW. From the laser 26, the beam passes to a modulator which in this example is a model 20 electro-optical modulator obtained from Coherent Associates. This device is a Pockels-Effect modulator with input and output polarizers which are crossed so that the light coming out has its electric field oriented in the horizontal plane. This permits the modulated laser light to be coupled efficiently to the recording surface and also to efficiently redirect the back-reflected light to the detector. The modulator is driven through a Coherent Associates model 30 Driver, which has a nominal bandwidth extending from DC to 10 MHz. The modulator driver is controlled by a fast pulse generator, namely a model 2101 Pulse Generator from Tektronix (nominal pulse rise time from 10-90%, 5 nsec). This device can be adjusted to provide pulses from 40 nsec to 40 msec in width.

A master-slave JK flip-flop; namely the CD 4027AE CMOS flip-flop from RCA, is used as a "one and only one" trigger source for the pulse generator and a CD 4047AE CMOS monostable multi-vibrator, from RCA, is triggered by the JK flip-flop to produce the pulse which either gates or triggers the pulse generator. The output from the laser 26 can thus be pulsed at pulses of a duration controlled by the pulse duration of the pulse generator.

From the modulator the beam passes to an expander collimator 27. This expands the beam to a diameter somewhat greater than the diameter of the lens 31, i.e. to about 0.7 cm. The expander collimeter consists of two microscope objective lenses, one of which focuses the beam from the modulator down to an aperture of a spatial filter. The spatial filter is a ten micron copper pinhole aperture obtained from Optimation Ltd. It is somewhat smaller than the beam, which is focused onto the aperture. The other microscope objective lens collects the light emerging from the copper pinhole and reconverges it to a collimated beam of diameter about 0.7 cms. The effect of the expander collimater 27 is that, with about a 40% loss in power, the higher Fourier components of the beam profile are eliminated, yielding a much smoother distribution.

From the expander collimater 27, the beam passes to a polarizing beamsplitter cube 28 from Perkin-Elmer:
The beamsplitter has the following characteristics:
Maximum Transmittance T to "P" state polarization: 95±5%
Maximum Reflectiveity R to "S" state polarization: 99±1% (entrance and exit faces are coated for minimum R)
Wavelength range: 4880 Å–5145 Å
Acceptance Angle: Normal incidence ±1°
Aperture: Central 12 mm The beamsplitting plane of this device has a special multilayer coating so that light which is polarized with its electric field parallel to the vertical axis of this plane (in the "S" state) is 99% reflected (±1%), whereas light with its plane of polarization perpendicular to this axis (in the "P" state) is 95% transmitted (±5%).

The beam passes to a quarter-wave plate 29 which is a rhomboidal piece of glass with parallel input and output faces (a Fresnel's Rhomb). In this device, by two internal reflections, plane polarized light at its input is converted into circularly polarized light at its output.

The lens 31 is a #462097, L. D. Epiplan 40/0.60 lens from Carl Zeiss Canada Ltd., having the following characteristics:
Numerical aperture $\alpha$: 0.60
Working distance: 4.4 mm
Magnification: 40×
Resolution: ~0.5 $\mu$m at $\lambda = 4880$ Å
Since the laser 26 is effectively a source at infinity, it is necessary to use in association with lens 31 a negative compensating lens to create a vertual source at ~160 mm. The negative lens is a #95,425 lens (diameter: 12 mm; focal length: −148 mm) from Edmund Scientific Products.

The lens 31 focuses the beam to a diffraction-limited spot on the surface of a layer 11 of APIEZON W wax coated onto a glass slide from a concentrated, viscous solution thereof in toluene and permitted to dry to a thickness which is greater than 1 micron.

The coarse focus control in the form of a micrometer stage, is used to move the lens 31 along its axis to approximately position its focal plane on the recording surface, and a fine focus control is also used. This is a model ED-25 Piezoelectric Translator from Jodon Engineering Associates, Inc., Ann Arbor, Mich. (1.3 $\mu$m extension per 100 V, 32 $\mu$m total extension), used from ultra-fine control of the position of the lens focal plane of the lens 31, so that the beam 12 is focused precisely at the surface 13 of the layer 11. A high voltage power supply (Kepco model ABC425M, 500 V programmable power supply) is used to drive the piezoelectric fine-focus control. This power supply was set up in the "programmable-by-resistance" mode and a Bourns 10 k$\Omega$ multiturn potentiometer was used to vary the programming resistance, and thereby control the fine focus.

The target 21 including the film of recording medium 11 is mounted on a turntable capable of moving the target relative to the stationary laser beam 12 at a surface speed of about 2 meters per second, whereby the laser beam 12 sweeps along a track on the film 11. This is approximately the minimum surface speed required for recording at 2 megabits per second with a series of 200 nsec pulses occurring once every half a microsecond. That is, in the 300 nsec between pulses, the target has moved a little more than the 0.5 $\mu$m diffraction-limited width of the recording spot, which has been repositioned over a fresh, unrecorded zone.

Under these conditions, fine recording marks in the form of bumps about 0.25 $\mu$m in height and about 0.5 $\mu$m in width will be close-packed along the recording track with little or no merging. The power level of the light required at said diffraction-limited spot at the recording surface in order to achieve a high-amplitude recording at this surface speed is about 3 mW (corresponding to an intensity of about 15 mW per square micron).

If the laser is operated continuously and the diffraction-limited spot is scanned along the recording track with the power level being maintained at about 3 mW (corresponding to about 15 mW per square micron, the bumps are erased and are replaced by a low ridge about 0.1 $\mu$m in height and about 0.5 $\mu$m wide. Information can be re-recorded on the erased track by pulsing the laser, as before, whereby raised bumps, having an elevation of about 0.2 $\mu$m relative to the surface of the ridge, can once more be produced. The cycle of erasure and re-recording can be repeated at least 1,000 times.

The detector system used to provide an output signal comprises the polarizing beamsplitter 28, from which the beam 34 reflected from the surface passes to an output spatial filter, which is a variable iris aperture 32 from Edmund Scientific (Aperture: 1 mm to 1 cm). The device 32 is mounted with its aperture in the vertical plane on two orthogonally-mounted translation stages so that both the size of the aperture and its position in the back-reflected beam 34 can be finely adjusted.

Optical detector 33 is an 8644/2B 10 stage Special-Line photomultiplier tube from RCA, having the following characteristics:
Spectral Response: S20
Wavelength of Max. response 4200 Å
Sensitivity (@ 1500 V cathode-anode):
  Cathode: 64 mA/W
  Anode: $5.1 \times 10^3$ A/W
Current gain (@ 1500 V): $8 \times 10^4$
Anode dark current (@ 1380 V): 1.5 nA
Quantum Efficiency (@ 1500 V, $\lambda=4880$ Å): 14%
Rise time (@ 1500 V): <10 nsec
Bandwidth: ~35 MHz This high-gain optical sensor converts the intensity changes of the weak beam of light coming through the output spatial filter 32 (typically 1 $\mu$W during playback) into a series of current pulses which are then converted to voltage pulses by a fast video amplifier connected as a current-to-voltage converter. When operating the detector system (i.e. reading the recorded information) the laser can be operated continuously at power levels such that the intensity of the diffraction-limited spot at the surface of the film is at least 300 $\mu$W, so that a high output signal to noise ratio can be obtained.

The video amplifier used is a model 1430 FET operational amplifier from Teledyne Philbrick, having the following characteristics:
Gain Bandwidth Product: 100 MHz
Settling Time to 1% for a 10 V step: 70 nsec
Slew Rate: 500 V/$\mu$sec
Output current Range: $\pm 50$ mA
Input Bias Current (@ 25° C.): $-500$ pA
Input Impedance (@ dc): $10^{82}\Omega$ 3 pG
Noise (referred to Input):
  Midband current (1.6 to 160 Hz): 2 pA
  Wideband voltage (1.6 Hz to 16 MHz): 9 $\mu$V The output signal is obtained as a drop in output from the video amplifier when the laser beam is incident on a bump 16 as compared with the output obtained when the beam is reflected from the smooth surface 13 of the layer 11. A modulated depth of output signal in the range of 25% to 100% is achieved.

As noted previously, recording marks in the form of crater-like pits can be produced in the surface of an iodine-doped cured epoxy resin material using the apparatus and procedures as described in detail above with reference to FIG. 2 of the accompanying drawings, and substituting a cured epoxy resin layer, blackened by iodine-vapor doping for the film of APIEZON W. These crater-like pits can be formed using a pulsed beam of light focused to a diffraction-limited spot of light with a power level at the surface of the epoxy resin of about 3 mW, with a pulse duration of about 100 to 200 nanoseconds and can be erased by sweeping the spot along the recording track with the laser operated continuously at the same power level.

I claim:

1. An information-recording process comprising the steps of:
providing a recording medium exhibiting first and second stable solid physical states associated with different respective specific volumes and being selectively producible in said states by heating said medium and cooling it from the heated state at selected rates of cooling;
applying heat transiently to a localised volume of said medium adjacent its surface, said volume being sufficiently large in relation to the area of the surface of the medium that is heated that on transition between said first and second states an area of changed surface curvature exhibiting a vertical to transverse aspect ratio of at least 1:10 is produced at the surface, said area providing at its edges a crisp discontinuity from the plane of said surface; said medium being originally in one of said first and second states; and permitting said volume to cool under conditions selected so that said volume is converted to the other of said first and second states.

2. An information-recording process comprising irradiating an optically smooth and homogeneous surface of a recording medium with focused radiation, said medium being a solid having first and second solid states associated with different respective specific volumes and being selectively producible in said states by heating said medium and cooling it from the heated state at selected rates of cooling, pulsing said focused radiation to thereby transiently heat a sharply-defined localised volume of said medium adjacent the surface, said volume extending sufficiently deeply into the medium that on transition between the first and second states there is obtained an area on said surface bordered by a crisp discontinuity from the plane of said surface and exhibiting a change in surface curvature with a vertical to transverse aspect ratio of at least 1:10; and permitting said volume to cool at a rate such that a transition between said first and second states is obtained, whereby said area of changed surface curvature on said surface is obtained in crisply-defined relief.

3. A process as claimed in claim 2 wherein said radiation is focused to a spot of minimum diameter substantially co-incident with said surface, said radiation diverging within said medium below said spot of minimum diameter, whereby a volume having a downwardly-increasing cross-section is melted in said medium below said area.

4. A process as claimed in claim 3 wherein said spot is a diffraction-limited spot.

5. A process as claimed in claim 2 wherein said solid recording medium has values of 1/e attenuation length with respect to said radiation and of percentage specific volume change in transition between said first and second states such that the product $$dV \cdot L$$

is about 2 µm to about 150 µm wherein L is the 1/e attenuation length in microns and $$dV = (V_1/V_2) \times 100$$

wherein $V_1$ is the magnitude of the difference in specific volume between said first and second states, and $V_2$ is the original specific volume of said medium.

6. A process as claimed in claim 5 wherein said product is at least 4 µm.

7. A process a claimed in claim 5 wherein said product is about 7 µm.

8. A process as claimed in claim 5 wherein said radiation is focused to a spot of minimum diameter substantially co-incident with the surface of said medium, said radiation diverging within said medium below said spot of minimum diameter.

9. A process as claimed in claim 8 wherein said attenuation length L is about 1/10th to about twice the width of said melted area.

10. A process as claimed in claim 9 wherein said attenuation length is about ½ to about twice said width.

11. A process as claimed in claim 9 wherein said attentuation length is substantially the same as said width.

12. A process as claimed in claim 5 wherein said percentage specific volume change dV is at least about 4%.

13. A process as claimed in claim 12 wherein said percentage specific volume change dV is at least about 6%.

14. A process as claimed in claim 13 wherein the thermal conductivity of said material is less than about 5 mW/cm°K.

15. A process as claimed in claim 14 wherein the thermal conductivity of said material is less than about 3 mW/cm°K.

16. A process as claimed in claim 2 wherein said first and second states are crystalline and amorphous states, respectively.

17. A process as claimed in claim 16 wherein the glass transition temperature between said amorphous and crystalline states is at least about 90° C.

18. A process as claimed in claim 16 wherein said medium is crystalline and exhibits an increase in specific volume on transition to the amorphous state whereby a crisply-defined bump on the surface of said recording medium is obtained.

19. A process as claimed in claim 18 wherein said medium comprises a film of Apiezon W wax deposited on a substrate from a concentrated solution thereof.

20. A process as claimed in claim 18 wherein said medium comprises caramelized sucrose.

21. A process as claimed in claim 16 wherein said medium is an amorphous solid that exhibits a decrease in specific volume on transition to the crystalline state, whereby a crisply-defined pit is obtained on the surface of said medium.

22. A process as claimed in claim 21 wherein said medium comprises an iodine-doped cured epoxy resin layer prepared by exposing a cured epoxy resin material to iodine vapor and permitting sufficient vapor to be absorbed into the resin to impart a blackened color thereto.

23. A process as claimed in claim 2 including reproducing said recorded information by scanning over said area of changed surface curvature with a spot of light, and detecting the change in intensity of light reflected from the surface of said medium as the spot scans over said area using an optical sensor having a filter interposed between it and the surface of said medium, said filter passing to the sensor a selected portion of the light reflected from the surface that exhibits a greater modulation than the aggregate of the reflected light reflected from the surface.

24. A process as claimed in claim 2 wherein said medium is an iodine-doped polymeric resin material prepared by exposing a polymeric resin material to iodine vapor and permitting sufficient iodine vapor to be absorbed into the resin to impart a blackened color thereto and thereby impart to the material a predetermined 1/e attenuation length with respect to the laser beam.

25. An information-recording process comprising the steps of: providing a layer of a recording medium comprising a film of APIEZON W wax deposited on a substrate from a concentrated solution thereof; and exposing the surface of said film to a pulse of radiation focused to a spot at said surface.

26. A process as claimed in claim 2 or 25 wherein said focused radiation comprises a focused laser beam.

27. A method for erasing information encoded on a recording medium comprising a film of APIEZON W wax, said information being encoded in the form of bumps of raised surface relief on the surface of said film, comprising exposing said surface to continuously-operated focused radiation that is focused to a spot at said surface.

28. A method as claimed in claim 27 wherein said radiation is laser radiation.

29. An information-recording process comprising the steps of: providing a recording medium comprising an iodine-doped cured epoxy resin prepared by exposing a cured clear epoxy resin material to iodine vapor and permitting said resin to absorb sufficient vapor to impart a blackened color thereto; and exposing said resin to a pulse of focused radiation focused to a spot at the surface of said resin.

30. A process as claimed in claim 29 wherein said radiation is laser radiation.

31. Information-recording apparatus comprising means providing a beam of radiation; a recording medium having first and second solid states associated with different respective specific volumes and being selectively producible in said states by melting said medium and cooling it from the molten state at selected rates of cooling, said medium having a 1/e attenuation length with respect to radiation of wavelength characteristic to said beam of value L μm, and having the product $$dV.L$$

wherein dV is the percentage specific volume change for the transition between said states, of numerical value from about 2 μm to about 150 μm, dV being defined as $$dV = (V_1/V_2) \times 100$$

wherein $V_1$ is the magnitude of the difference in specific volume between said states and $V_2$ is the original specific volume; means for focusing said beam to a spot of minimum diameter co-incident with the surface of said medium; and means for pulsing said beam at controlled power levels capable of melting an area of predetermined size on said medium, whereby said area can be changed between said first and second states and a spot of crisply-defined surface relief can be created or erased.

32. Apparatus as claimed in claim 31 including means for reproducing the recorded information comprising: means for scanning a spot of light over the surface of said medium; an optical sensor for detecting a change in the intensity of light reflected from the surface of said medium as said spot scans over said area of changed surface relief; and a filter interposed between the sensor and the surface of said medium said filter passing to the sensor a selected portion of the light reflected from the surface that exhibits a greater modulation than the aggregate of the reflected light reflected from the surface.

33. Apparatus as claimed in claim 31 wherein said means providing a beam of radiation comprise a laser.

34. Apparatus for reproducing information from a recording medium having on a smooth surface thereof discrete areas of surface relief of predetermined uniform width, said apparatus comprising: means for scanning a spot of light over the surface of said medium, an optical sensor for detecting changes in the intensity of light reflected from said surface as said spot scans over an area of surface relief, and a filter interposed between the sensor and said surface said filter passing to the sensor a selected portion of the light reflected from the surface that exhibits a greater modulation than the aggregate of the reflected light reflected from the surface.

35. An information recording structure comprising a recording medium that is a solid having first and second solid states associated with different respective specific volumes and being selectively convertible between said states by heating the medium and cooling it from the heated state at a selected rate of cooling, said medium having an optically smooth and homogeneous surface, and the bulk of said medium existing in one of said states; and an optically-transparent protective barrier layer extending over said surface.

36. An information recording structure as claimed in claim 35 wherein said medium is characterised by having its value of the product $$dV.L$$

in the range about 2 μm to 150 μm, wherein $$dV = (V_1/V_2) \times 100$$

wherein $V_1$ is the magnitude of the difference in specific volume between said first and second states and $V_2$ is the specific volume of said material in said one state, and L is the 1/e attenuation length in microns of said medium with respect to laser radiation.

37. An information-recording structure comprising a body of a recording medium having an optically smooth and homogeneous surface, said recording medium being selectively and reversibly convertible, on exposure of the surface to a spot of focused radiation, between first and second non-porous stable solid states associated with different respective specific volumes that yield on the exposed spot a change in surface curvature having a vertical to transverse aspect ratio of at least 1:10.

* * * * *